US012801038B2

(12) United States Patent
Hong et al.

(10) Patent No.: US 12,801,038 B2
(45) Date of Patent: Nov. 17, 2026

(54) EXTREME ULTRAVIOLET (EUV) SOURCE AND A SUBSTRATE PROCESSING APPARATUS INCLUDING THE SAME

(71) Applicant: SAMSUNG ELECTRONICS CO., LTD., Suwon-si (KR)

(72) Inventors: Seungpyo Hong, Suwon-si (KR); Sunghyup Kim, Suwon-si (KR); Injae Lee, Suwon-si (KR); Daegeun Yoon, Suwon-si (KR); Taewoong Um, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 20 days.

(21) Appl. No.: 18/595,753

(22) Filed: Mar. 5, 2024

(65) Prior Publication Data

US 2025/0076776 A1 Mar. 6, 2025

(30) Foreign Application Priority Data

Sep. 1, 2023 (KR) ........................ 10-2023-0116351

(51) Int. Cl.
*G03F 7/00* (2006.01)

(52) U.S. Cl.
CPC ...... *G03F 7/70933* (2013.01); *G03F 7/70033* (2013.01); *G03F 7/702* (2013.01); *G03F 7/70808* (2013.01); *G03F 7/70916* (2013.01); *G03F 7/70925* (2013.01)

(58) Field of Classification Search
CPC .. G03F 7/70933; G03F 7/70033; G03F 7/702; G03F 7/70233; G03F 7/707; G03F 7/70716; G03F 7/70925; G03F 7/70175; G03F 7/70916; G03F 7/70908; G03F 7/708; G03F 7/70808; G03F 7/70816; G03F 7/70825; G03F 7/70841; G03F 7/7085; G03F 7/70858; G03F 7/70883; G03F 7/70866; G03F 7/709; G03F 7/70941; G03F 7/7095; G03F 7/70975; G03F 7/70983; G03F 7/70991; H05G 2/00–0094
USPC ........................ 355/18, 27, 30, 52–55, 66–77
See application file for complete search history.

(56) References Cited

U.S. PATENT DOCUMENTS

| | | | | |
|---|---|---|---|---|
| 8,198,615 | B2 | 6/2012 | Bykanov et al. | |
| 10,162,277 | B2 | 12/2018 | Chien et al. | |
| 10,548,209 | B2 | 1/2020 | Ishihara | |
| 10,754,254 | B1 * | 8/2020 | Bai | G03F 7/70733 |
| 10,955,749 | B2 | 3/2021 | Labetski et al. | |
| 11,350,514 | B2 | 5/2022 | Koge et al. | |
| 11,392,040 | B2 | 7/2022 | Chen et al. | |
| 2009/0154642 | A1 * | 6/2009 | Bykanov | G03F 7/70908 378/34 |
| 2020/0089124 | A1 * | 3/2020 | Labetski | G03F 7/70916 |

(Continued)

*Primary Examiner* — Christina A Riddle
(74) *Attorney, Agent, or Firm* — Morgan, Lewis & Bockius LLP

(57) ABSTRACT

An extreme ultraviolet (EUV) source includes a housing providing a light-collecting space having a cone shape becoming narrower in a first direction, an EUV collector disposed at a first end portion of the housing and including a reflection surface disposed toward the light-collecting space, and an exhaust pipe coupled to the housing and providing an exhaust flow path connected to the light-collecting space, wherein the exhaust pipe extends from the housing and forms an acute angle with the housing toward a second end portion of the housing.

17 Claims, 10 Drawing Sheets

(56) References Cited

U.S. PATENT DOCUMENTS

| | | | | |
|---|---|---|---|---|
| 2021/0141311 | A1 | 5/2021 | Labetski et al. | |
| 2021/0307150 | A1* | 9/2021 | Koge .................. | G03F 7/70033 |
| 2022/0390852 | A1* | 12/2022 | Heijmans ............ | G03F 7/70916 |

* cited by examiner

EXTREME ULTRAVIOLET (EUV) SOURCE AND A SUBSTRATE PROCESSING APPARATUS INCLUDING THE SAME

CROSS-REFERENCE TO RELATED APPLICATION

This patent application claims priority under 35 U.S.C. § 119 to Korean Patent Application No. 10-2023-0116351, filed on Sep. 1, 2023, in the Korean Intellectual Property Office, the entire contents of which are hereby incorporated by reference.

TECHNICAL FIELD

The present disclosure relates to an extreme ultraviolet (EUV) source and a substrate processing apparatus including the same, and more particularly, to an EUV source capable of effectively exhausting a residue in the EUV source and a substrate processing apparatus including the same.

DISCUSSION OF RELATED ART

A semiconductor device may be manufactured using a series of processes. For example, a semiconductor device may be manufactured using an exposure process, an etching process, a deposition process, and a plating process. In some cases, EUV light may be used for performing an exposure process for manufacturing a semiconductor device. An EUV source may be used to generate the EUV light. The exposure process may generate a residue. To exhaust the residue in the EUV source, an exhaust pipe may be coupled to the EUV source. If the residue is not effectively exhausted, contamination in the EUV source may be increased and the contamination may cause defects in the semiconductor device.

SUMMARY

Embodiments of the inventive concepts may provide an extreme ultraviolet (EUV) source capable of effectively exhausting a residue in the EUV source, a substrate processing apparatus including the same, and a method of processing a substrate using the substrate processing apparatus.

In an aspect, an extreme ultraviolet (EUV) source may include a housing providing a light-collecting space having a cone shape becoming narrower in a first direction, an EUV collector disposed at a first end portion of the housing and including a reflection surface disposed toward the light-collecting space, and an exhaust pipe coupled to the housing and providing an exhaust flow path connected to the light-collecting space, wherein the exhaust pipe extends from the housing and forms an acute angle with the housing toward a second end portion of the housing.

In an aspect, a substrate processing apparatus may include a chamber, an extreme ultraviolet (EUV) source disposed in the chamber and configured to generate EUV light, an optical rig disposed in the chamber and configured to provide the EUV light generated from the EUV source to a reticle, and from the reticle to a substrate, a substrate chuck disposed in the chamber and configured to support the substrate, and a reticle stage disposed in the chamber and configured to hold the reticle. The EUV source may include a housing providing a light-collecting space that narrows in a first direction, an EUV collector disposed at a first end portion of the housing and including a reflection surface disposed toward the light-collecting space, and an exhaust pipe coupled to the housing and providing an exhaust flow path connected to the light-collecting space.

The exhaust pipe may extend from the housing and may form an acute angle with the housing toward a second end portion of the housing. A center portion of an outlet at which the exhaust flow path meets the light-collecting space may be disposed below a center portion of the light-collecting space extending in the first direction.

In an aspect, an extreme ultraviolet (EUV) source may include a housing providing a light-collecting space having a cone shape becoming narrower in a first direction, an EUV collector disposed at a first end portion of the housing and including a reflection surface disposed toward the light-collecting space, an intermediate focus cap disposed at a second end portion of the housing, and an exhaust pipe coupled to the housing and providing an exhaust flow path connected to the light-collecting space, wherein the exhaust pipe extends from the housing and forms an acute angle with the housing toward the second end portion of the housing, and wherein a center portion of an outlet at which the exhaust flow path is connected to the light-collecting space is disposed closer to the second end portion of the housing than the first end portion.

DETAILED DESCRIPTION

Figure 1:
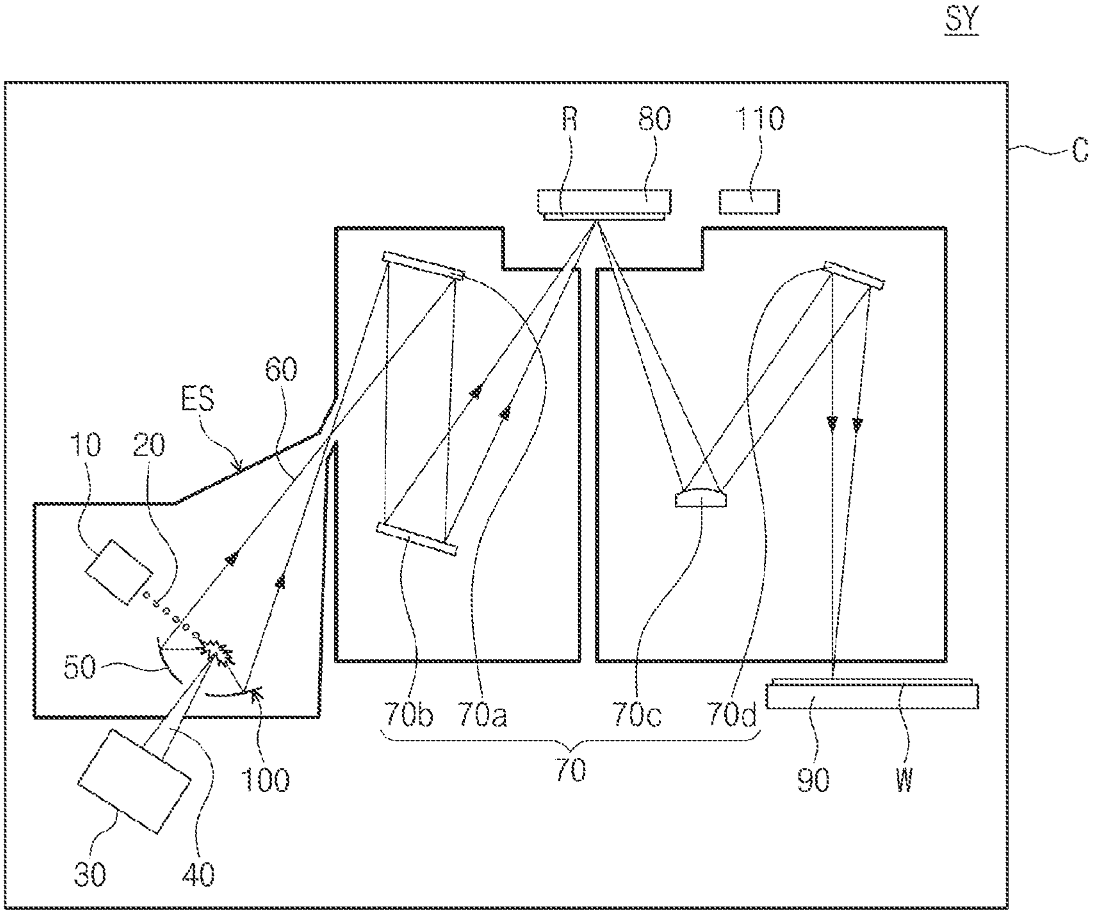
FIG. 1 is a schematic view illustrating a substrate processing apparatus according to some embodiments of the inventive concepts.

Hereinafter, embodiments of the inventive concepts will be described in detail with reference to the accompanying drawings. The same reference numerals or the same reference designators may denote the same elements or components throughout the specification.

FIG. 1 is a schematic view illustrating a substrate processing apparatus according to some embodiments of the inventive concepts.

Referring to FIG. 1, a substrate processing apparatus may be an exposure apparatus SY. The exposure apparatus SY may be configured to perform an exposure process on a substrate W. In other words, the exposure apparatus SY may be an apparatus capable of irradiating extreme ultraviolet (EUV) light to the substrate W to form a pattern on the substrate W. For example, the exposure apparatus SY may irradiate the EUV light onto the substrate W to form a photoresist pattern on the substrate W. The exposure apparatus SY may include a chamber C, an EUV source ES, an optical rig 70, a reticle stage 80, and a substrate chuck 90.

The chamber C may provide a space independent of the outside, which the substrate W and a reticle R may be disposed. For example, the chamber C may be maintained in a vacuum state.

The EUV source ES may be disposed in a side portion of the chamber C. The EUV source ES may be configured to generate EUV light 60. The EUV light 60 may be a plasma beam. The EUV source ES may include a housing H (see FIG. 2), a droplet generator 10, a laser generator 30, an EUV collector 50, and an exhaust part 200 (see FIG. 2).

The housing H may provide a light-collecting space. The EUV light 60 may be generated in the housing H.

The droplet generator 10 may be configured to generate a droplet 20. The droplet generator 10 may generate the droplet 20 and provide the droplet 20 into the housing H. The droplet generator 10 may further include a nozzle (not shown). The nozzle may be disposed toward the housing H and the droplet 20 may be provided into the housing. The droplet 20 may include metal liquid of tin (Sn), xenon (Xe), titanium (Ti), or lithium (Li).

The laser generator 30 may be configured to provide laser light 40 into the housing H and to generate the EUV light 60. More particularly, the laser generator 30 may provide the laser light 40 to the droplet 20 provided from the droplet generator 10 to generate the EUV light 60. For example, the laser light 40 may irradiate the droplet 20, vaporizing the droplet 20 and forming a high-density plasma. The high-density plasma may release light, and in particular, release the EUV light 60.

The EUV collector 50 may be coupled to the housing H. The EUV collector 50 may be configured to reflect the EUV light 60. In other words, the EUV collector 50 may reflect the EUV light 60 generated in the housing H. To achieve this, the EUV collector 50 may include a reflection surface. For example, the reflection surface may include a collector mirror and a lens, but embodiments of the inventive concepts are not limited thereto.

The exhaust part 200 may be coupled to the housing H. The exhaust part 200 may be configured to exhaust a material in the housing H to the outside of the housing H.

The optical rig 70 may be disposed relative to the reticle stage 80 and the substrate chuck 90. For example, the optical rig 70 may be configured to sequentially guide the EUV light 60 to the reticle R, and from the reticle R to the substrate W. The optical rig 70 may include a plurality of optical systems. For example, the plurality of optical systems may include a first optical system 70*a*, a second optical system 70*b*, a third optical system 70*c* and a fourth optical system 70*d* may be provided. The plurality of optical systems may be spaced apart from each other. For example, the first optical system 70*a* may be spaced apart from the second optical system 70*b*. Each of the plurality of optical systems may include a mirror and/or a lens. The plurality of optical systems may reflect the EUV light generated from the EUV source ES to guide the reflected EUV light to the reticle R, and from the reticle R to the substrate W. For example, the first optical system 70*a* and the second optical system 70*b* may guide the EUV light from the EUV collector 50 to the reticle R, and the third optical system 70*c* and the fourth optical system 70*d* from guide the EUV light from the reticle R to the substrate W. Hereinafter, a single optical system will be described as an example for the purpose of ease and convenience in explanation.

The reticle stage 80 may be disposed in the chamber C. The reticle stage 80 may be configured to hold or fix the reticle R at a certain position and with a certain orientation. In other words, the reticle stage 80 may include a reticle chuck (not shown). For example, the reticle stage 80 may be configured to hold the reticle R by electrostatic force using a static voltage. However, embodiments of the inventive concepts are not limited thereto, and in certain embodiments, the reticle stage 80 may include a vacuum chuck. The reticle R may be a reflective mask. The reticle R may be configured to reflect a portion of the EUV light 60 to the optical rig 70, for example, the third optical system 70*c*, and to absorb another portion of the EUV light 60. The portion of the EUV light 60 reflected by the reticle R and the portion of the EUV light 60 absorbed by the reticle R may define a pattern. In addition, the portion of the EUV light 60 reflected by the reticle R may be reflected by the optical rig 70 toward the substrate W. The reticle stage 80 may further include a plasma source 110. The plasma source 110 may provide plasma onto the reticle stage 80. Thus, the reticle R charged by the EUV source ES may be electrically neutralized. The plasma source 110 may be disposed outside the reticle chuck, but embodiments of the inventive concepts are not limited thereto.

The substrate chuck 90 may be disposed in the chamber C. The substrate chuck 90 may be configured to support the substrate W. In the present specification, the substrate W may be a silicon wafer, but embodiments of the inventive concepts are not limited thereto. The substrate chuck 90 may be configured to hold the substrate W by electrostatic force. The substrate chuck 90 may include an electrostatic chuck to hold the substrate W, but embodiments of the inventive concepts are not limited thereto. The substrate W may be exposed to the EUV light 60 provided from the optical rig 70.

Figure 2:
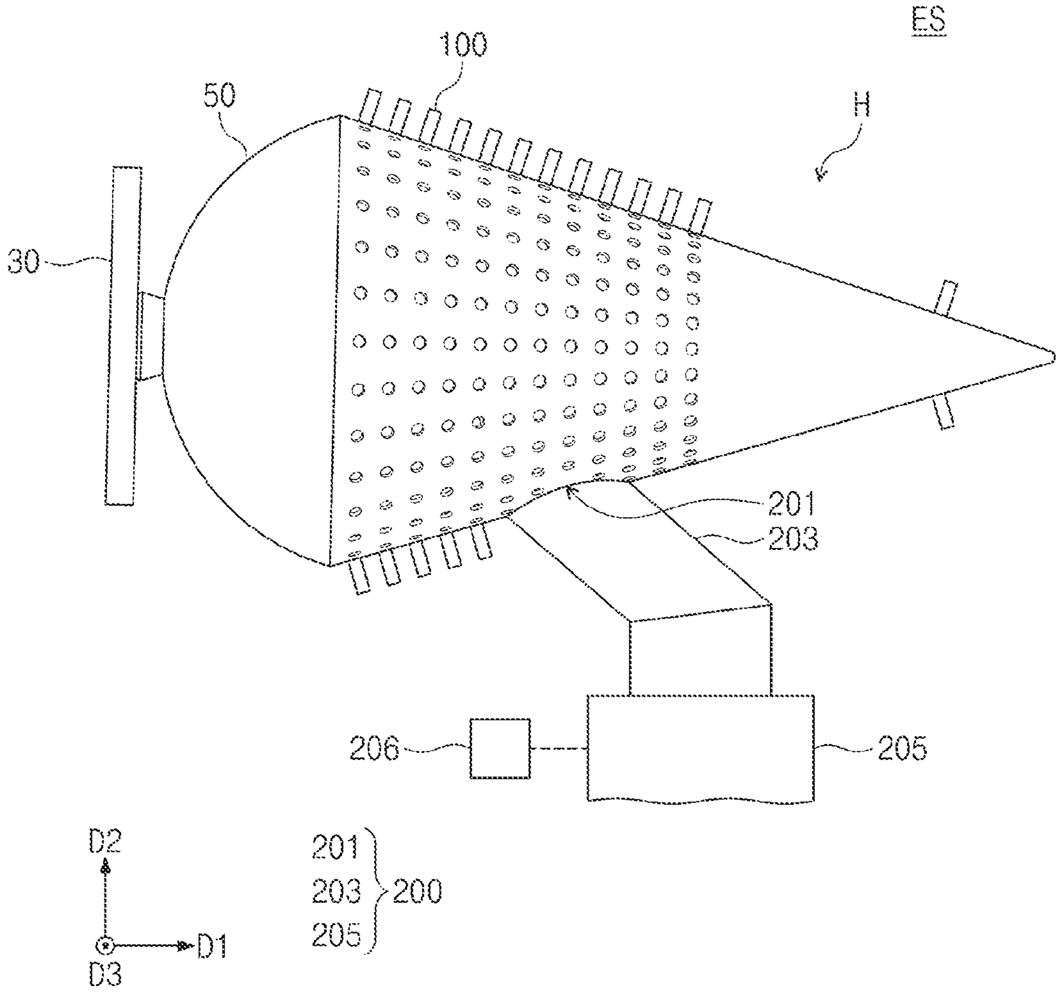
FIG. 2 is a perspective view illustrating an extreme ultraviolet (EUV) source according to some embodiments of the inventive concepts.
Figure 3:
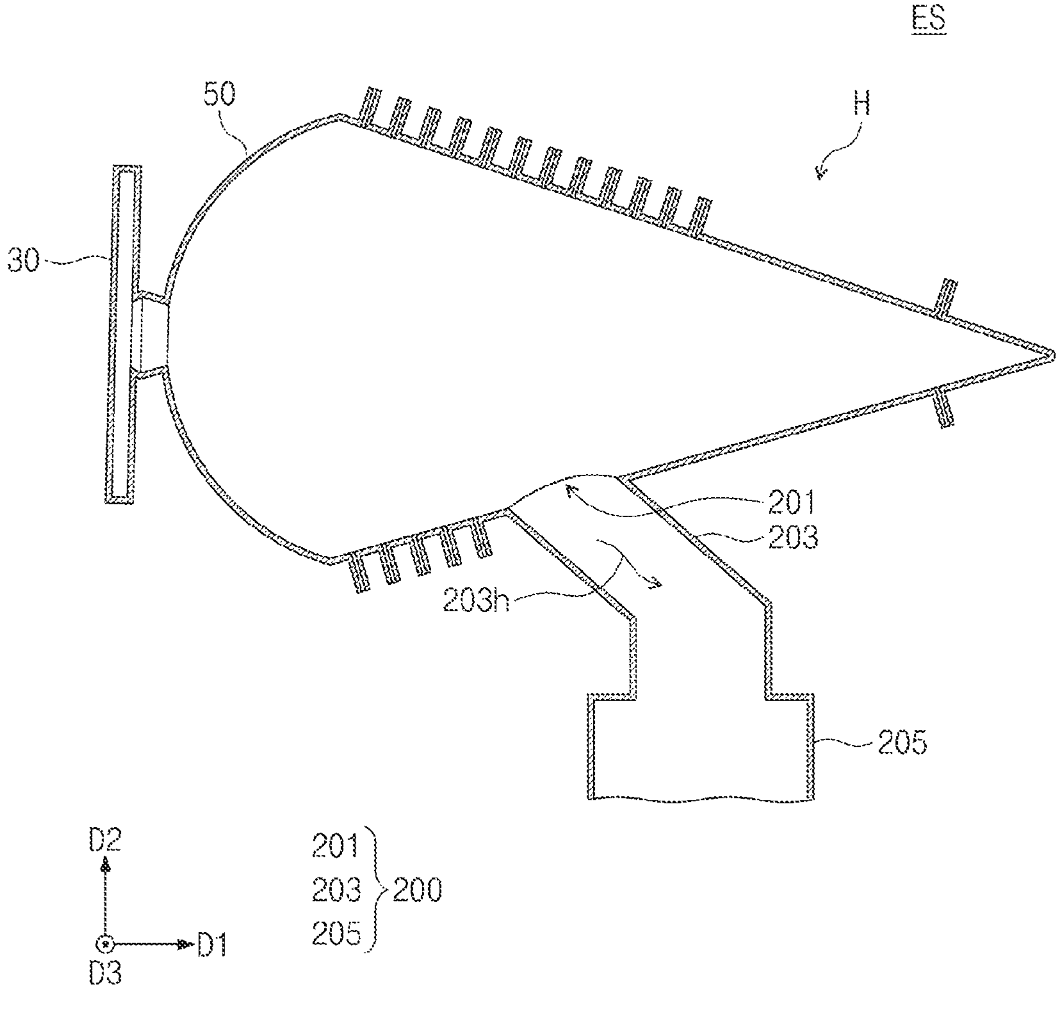
FIG. 3 is a cross-sectional view illustrating an EUV source according to some embodiments of the inventive concepts.
Figure 4:
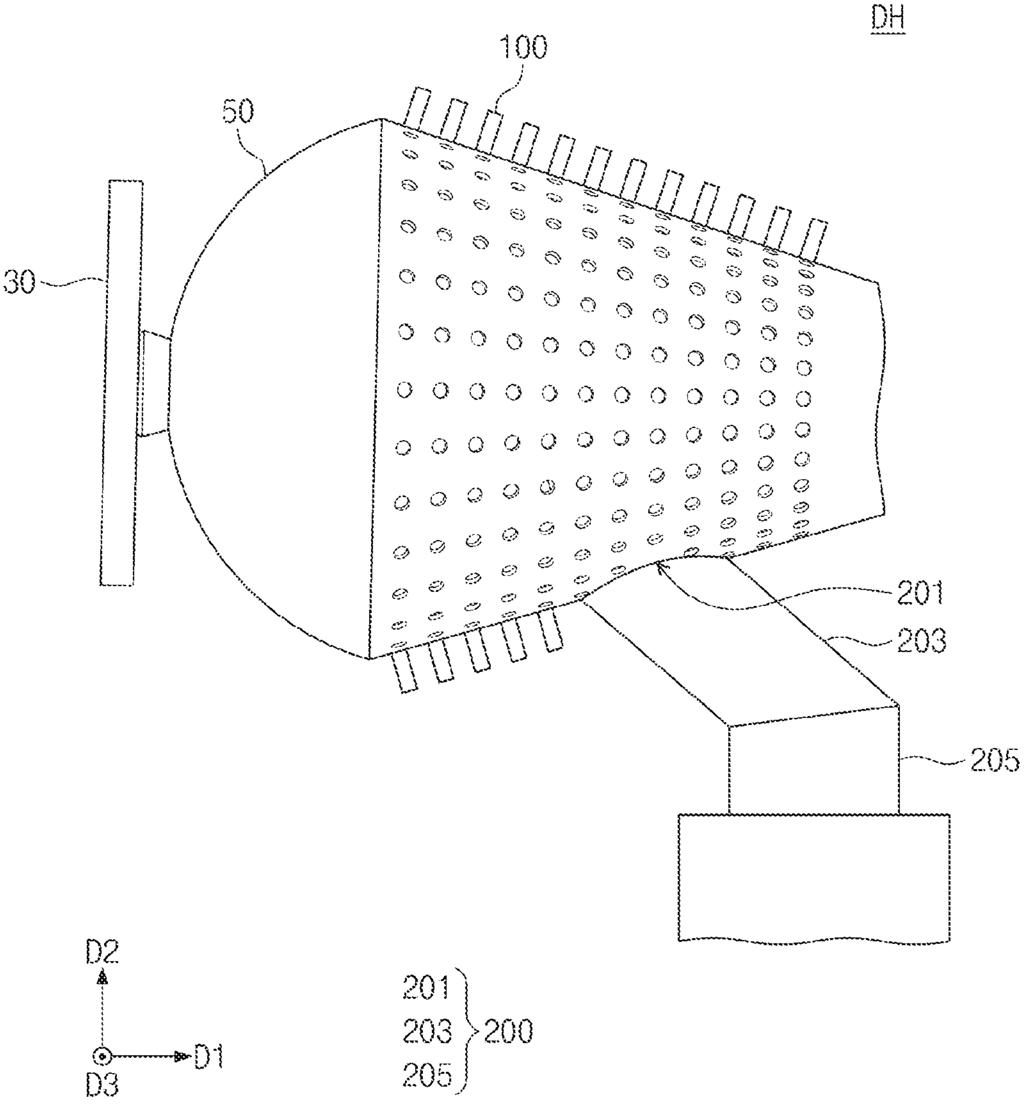
FIG. 4 is an enlarged view illustrating a portion of a substrate processing apparatus according to some embodiments of the inventive concepts.
Figure 5:
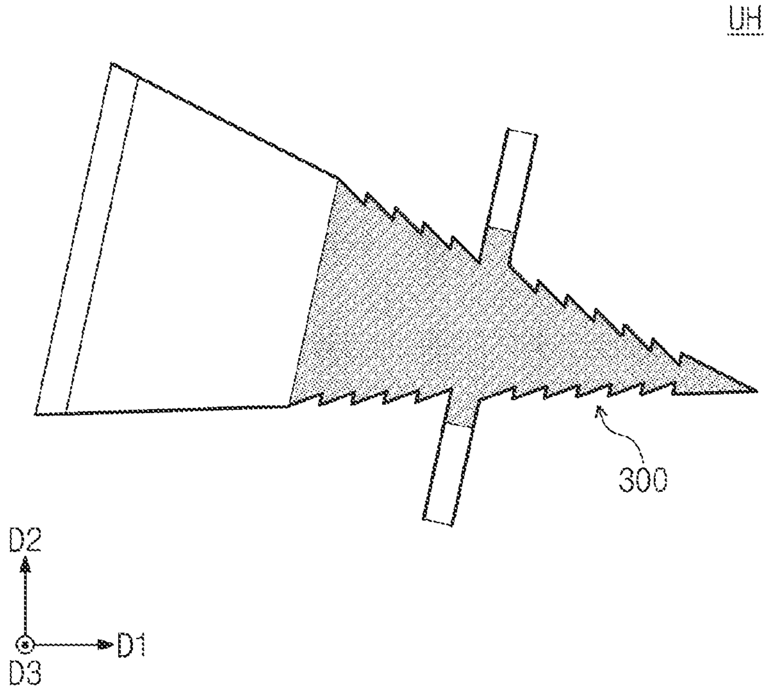
FIG. 5 is an enlarged view illustrating a portion of a substrate processing apparatus according to some embodiments of the inventive concepts.

FIG. 2 is a perspective view illustrating the EUV source ES according to some embodiments of the inventive concepts. FIG. 3 is a cross-sectional view illustrating the EUV source ES according to some embodiments of the inventive concepts. FIG. 4 is an enlarged view illustrating a portion of a substrate processing apparatus according to some embodiments of the inventive concepts. FIG. 5 is an enlarged view illustrating a portion of a substrate processing apparatus according to some embodiments of the inventive concepts.

Hereinafter, a direction D1 may be referred to as a first direction D1, a direction D2 intersecting the first direction D1 may be referred to as a second direction D2, and a direction D3 intersecting the first direction D1 and the second direction D2 may be referred to as a third direction D3. The first direction D1 may also be referred to as a vertical direction. In addition, the second direction D2 and the third direction D3 may also be referred to as horizontal directions.

Referring to FIGS. 2 to 5, the housing H may provide the light-collecting space (not labeled). The light-collecting space may become narrower in the first direction D1. In other words, the light-collecting space of the housing H may have a cone shape, but embodiments of the inventive concepts are not limited thereto. In some embodiments, the light-collecting space may be a cone with a constant slope that becomes narrower in the first direction D1. However, embodiments of the inventive concepts are not limited thereto, and in certain embodiments, the light-collecting space may have another shape. The EUV light 60 may be generated in the light-collecting space in the housing H. The housing H may include an upper housing UH (see FIG. 5) and a lower housing DH (see FIG. 4). The upper housing UH may be coupled on the lower housing DH.

The upper housing UH may provide a space through which the EUV light 60 may pass. The housing H may further include an intermediate focus (IF) cap (IF-cap 300) on the upper housing UH. The IF-cap 300 may be disposed at a first end portion of the housing H. The IF-cap 300 may provide a space becoming narrower in the first direction D1. For example, the IF-cap 300 may have a cone shape. The space provided by the IF-cap 300 may be a portion of the light-collecting space. The IF-cap 300 may have an inner surface having a stepped shape. Light reflected from the EUV collector 50 may pass through the IF-cap 300. For example, the IF-cap 300 disposed on the upper housing UH and may be configured to allow a passage of the EUV light 60 received from the EUV collector 50.

The lower housing DH may be disposed under the upper housing UH and may be connected to the upper housing UH. The EUV collector 50 may be coupled to a bottom of the lower housing DH and at a second end portion of the housing H. The first end portion and the second end portion may be disposed opposite each other. The lower housing DH may provide a space in which the EUV light 60 may be generated. The space provided by the lower housing DH may be a portion of the light-collecting space. The lower housing DH may further provide a plurality of housing through-holes 100. The housing through-holes 100 may penetrate the lower housing DH so as to be connected to the light-collecting space. The housing through-holes 100 may be disposed around the light-collecting space. For example, the housing through-holes 100 may be disposed to surround the light-collecting space. The housing through-holes 100 may be spaced apart from each other. The housing through-holes 100 may be spaced apart from each other at equal distances. Hereinafter, a single housing through-hole 100 will be described as an example for the purpose of ease and convenience in explanation.

The EUV collector 50 may be located at the second end portion of the housing H and may be coupled to the lower housing DH. The EUV collector 50 may have a parabolic shape, such as a hemispherical shape. The EUV collector 50 may include the reflection surface disposed toward the light-collecting space. For example, EUV collector 50 may reflect EUV light toward the light-collecting space. The EUV collector 50 may include a lens and/or a mirror, but embodiments of the inventive concepts are not limited thereto. The EUV collector 50 may reflect the EUV light 60 generated in the light-collecting space, wherein the EUV light 60 reflected by the EUV collector 50 may be collected at a certain area within the light-collecting space.

The exhaust part 200 may be connected to the housing H. The exhaust part 200 may include an exhaust pipe 203 connected to the light-collecting space. The exhaust pipe 203 may provide an exhaust flow path 203*h*. Residue in the housing H may be moved through the exhaust pipe 203. The exhaust part 200 may further include a scrubber 205. The scrubber 205 may purify the residue moved through the exhaust pipe 203. More particularly, the scrubber 205 may be connected to the exhaust pipe 203 and may purify the residue exhausted from the light-collecting space.

The laser generator 30 may be spaced apart from the housing H in the first direction D1. The laser generator 30 may be coupled to the EUV collector 50 at the second end portion of the housing H. The laser generator 30 may be configured to provide the laser light 40 to the light-collecting space of the housing H. More particularly, the laser generator 30 may provide the laser light 40 to the droplet 20 generated by the droplet generator 10 of the lower housing DH, thereby generating the EUV light 60. The laser generator 30 may include a path through which the laser light 40 passes.

Figure 6:
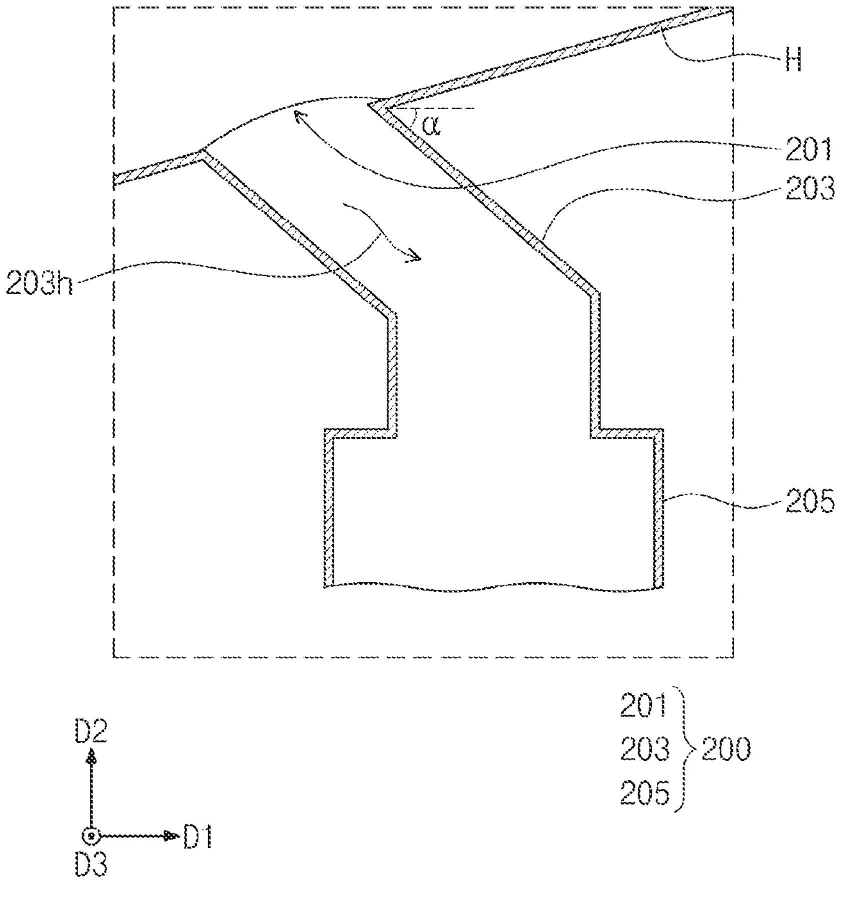
FIG. 6 is an enlarged view illustrating a portion of a substrate processing apparatus according to some embodiments of the inventive concepts.

FIG. 6 is an enlarged view illustrating a portion of a substrate processing apparatus according to some embodiments of the inventive concepts.

Referring to FIG. 6, the exhaust pipe 203 may extend from the housing H and may form an acute angle α with the first direction D1. For example, the acute angle α between the exhaust pipe 203 and the first direction D1 may be less than about 90°. More particularly, the acute angle α may be about 80° or less. More particularly, the acute angle α may be about 50° or less. Relative to the housing H, the exhaust pipe 203 may form an acute angle toward the IF-cap 300 disposed at the first end portion of the housing H. For example, the angle formed between the housing H and the exhaust pipe 203 on a side of the exhaust pipe 203 adjacent to the IF-cap 300 may be less than about 90°. More particularly, the angle formed between the housing H and the exhaust pipe 203 on a side of the exhaust pipe 203 adjacent to the IF-cap 300 may be less than about 80°. More particularly, the angle formed between the housing H and the exhaust pipe 203 on a side of the exhaust pipe 203 adjacent to the IF-cap 300 may be about 55°.

The exhaust pipe 203 may exhaust the residue from the light-collecting space. More particularly, the exhaust pipe 203 may exhaust the residue generated in the light-collecting space in the housing H. A place at which the exhaust flow path 203*h* of the exhaust pipe 203 meets the light-collecting space of the housing H may be referred to as an outlet 201. In other words, the outlet 201 may be a vent through which the residue may escape. The outlet 201 may vent the residue when the EUV light 60 is collected.

As shown in FIG. 3, the outlet 201 may be disposed at a level lower than a level of a center portion of the light-collecting space. More particularly, a center portion of an outlet 201 at which the exhaust flow path 203*h* is connected to the light-collecting space may be disposed below a center portion of the light-collecting space (e.g., a line of symmetry of the cone) extending in the first direction D1. A center portion of the outlet 201 at which the exhaust flow path 203*h* is connected to the light-collecting space may be disposed closer to the second end portion of the housing H and the EUV collector 50 than to the first end portion of the housing H and the IF-cap 300.

The scrubber 205 may be connected to the exhaust pipe 203. The scrubber 205 may purify the residue. More particularly, the scrubber 205 may purify the residue moved through the exhaust pipe 203. To achieve this, the scrubber 205 may include a scrubber housing, a catalyst in the scrubber housing, a cleaning solution-injecting nozzle in the scrubber housing, and/or a pump 206, which may move the residue.

Figure 7:
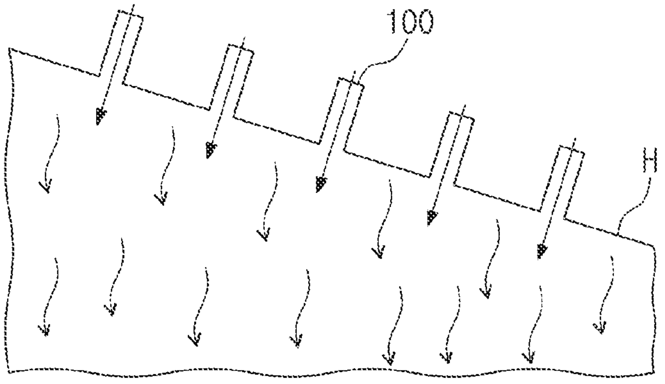
FIG. 7 is an enlarged view illustrating a portion of a substrate processing apparatus according to some embodiments of the inventive concepts.

FIG. 7 is an enlarged view illustrating a portion of a substrate processing apparatus according to some embodiments of the inventive concepts.

Referring to FIG. 7, the housing through-holes 100 may be spaced apart from each other. The housing through-holes 100 may be spaced apart from each other at equal distances. Hereinafter, a single housing through-hole 100 will be described as an example. However, embodiments of the inventive concepts are not limited thereto, and the housing through-holes 100 may be variously provided. The housing through-hole 100 may penetrate the lower housing DH. A hydrogen ($H_2$) gas (not shown) may flow through the housing through-hole 100 and into the housing H. More particularly, the housing through-hole 100 may be connected to the light-collecting space in the housing H to provide the $H_2$ gas into the light-collecting space through the housing through-hole 100. To achieve this, the housing through-hole 100 may be connected to an $H_2$ tank (not shown).

Figure 8:
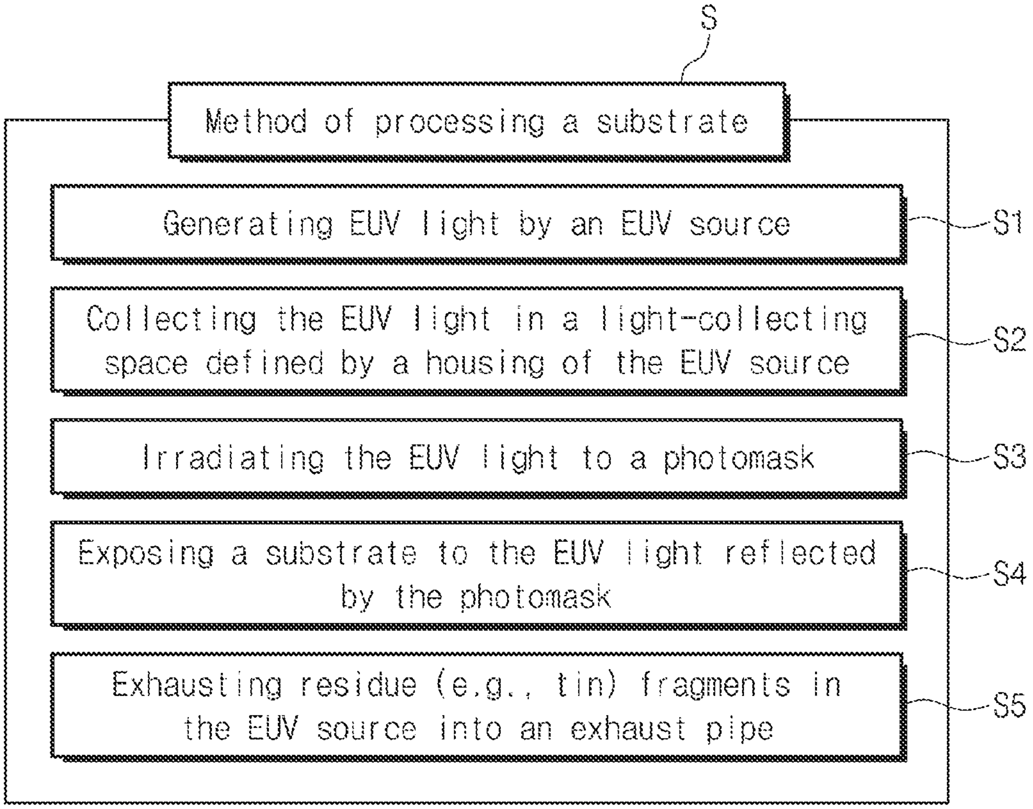
FIG. 8 is a flow chart illustrating a method of processing a substrate according to some embodiments of the inventive concepts.

FIG. 8 is a flow chart illustrating a method of processing a substrate according to some embodiments of the inventive concepts.

Referring to FIG. 8, a method of processing a substrate (S) may be provided. The method of processing a substrate (S) may be a method of processing a substrate disposed in the exposure apparatus SY described with reference to FIG. 1 by using the EUV source ES described with reference to FIGS. 2 to 5. The method of processing a substrate (S) may include generating EUV light 60 by the EUV source ES (S1), collecting the EUV light 60 in the light-collecting space defined by the housing H of the EUV source ES (S2), irradiating the EUV light 60 to a photomask (e.g., the reticle R) (S3), exposing the substrate W to the EUV light 60 reflected by the photomask (S4), and exhausting residue (e.g., tin) in the EUV source ES into the exhaust pipe 203 (S5).

Hereinafter, a method of processing a substrate (S) of FIG. 8 will be described with reference to FIG. 9 and FIG. 10.

Figure 9:
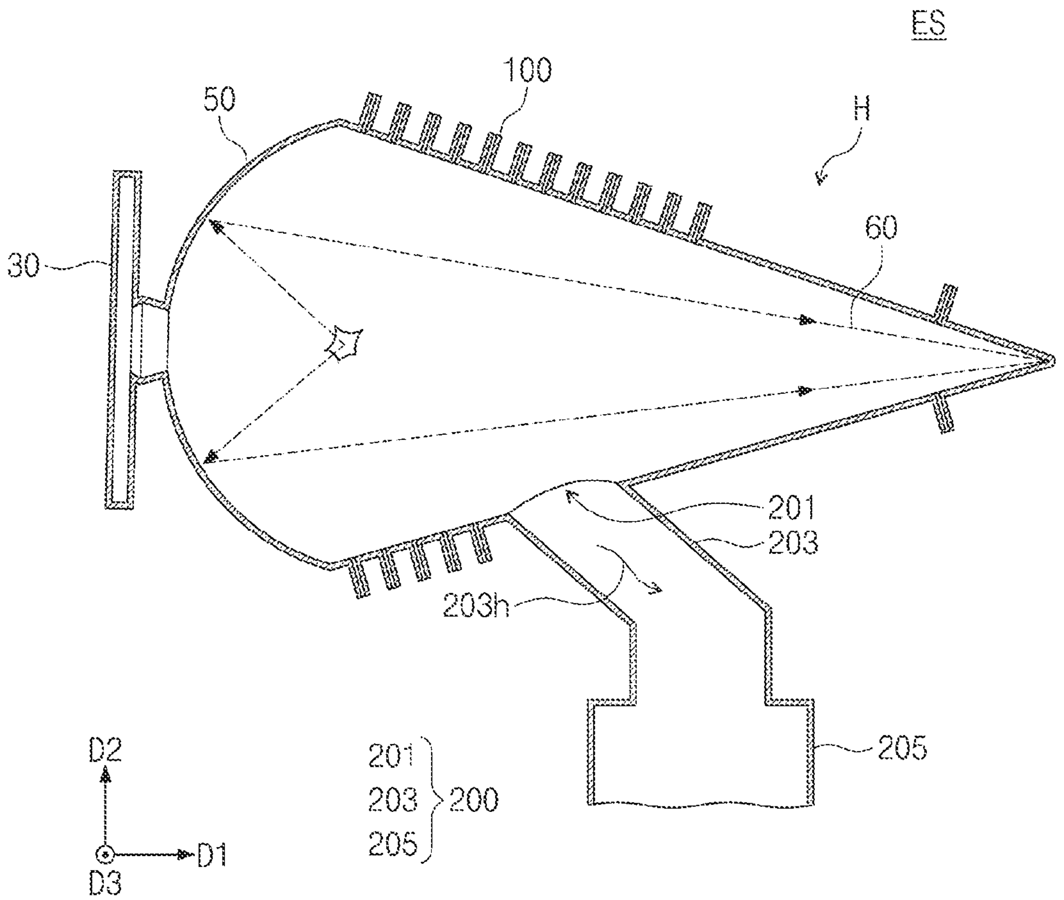
FIG. 9 and FIG. 10 are views illustrating operating states of a substrate processing apparatus according to some embodiments of the inventive concepts.
Figure 10:
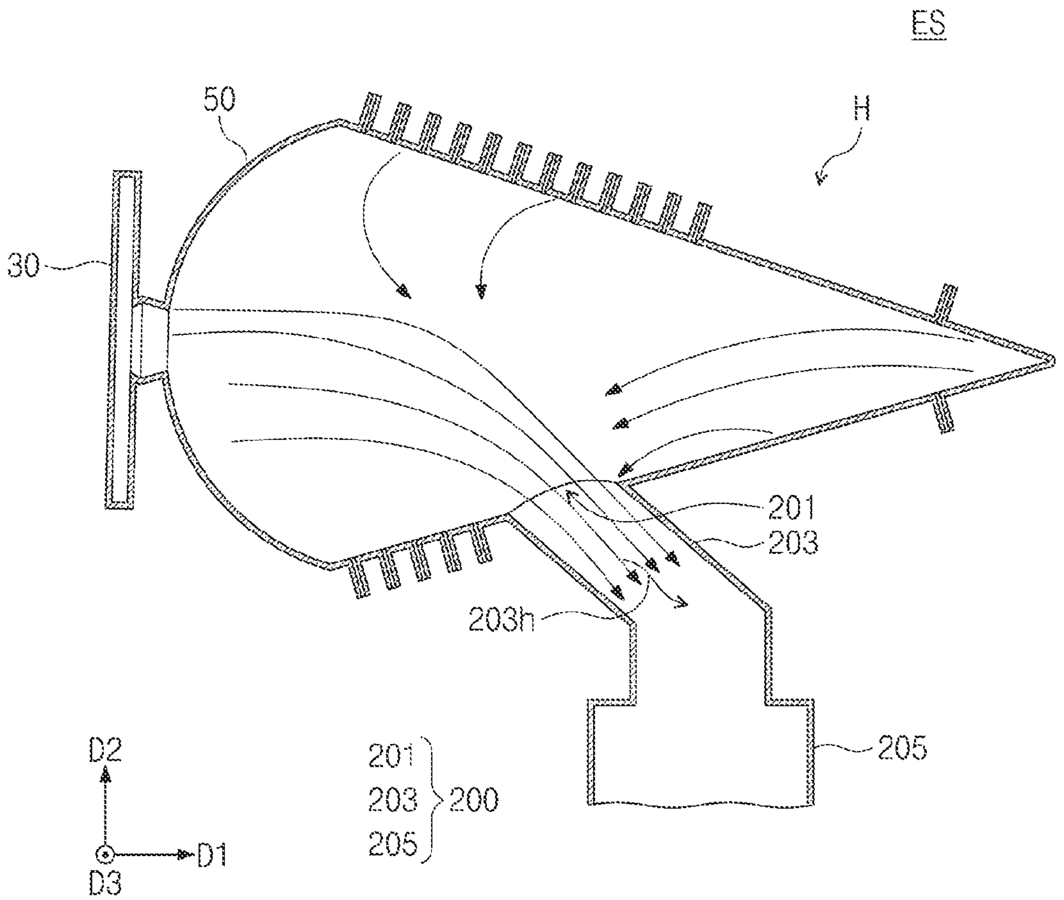

FIG. 9 and FIG. 10 are views illustrating operating states of a substrate processing apparatus according to some embodiments of the inventive concepts. Referring to FIGS. 8, 9 and 10, the generating of the EUV light 60 by the EUV source ES (S1) may include providing the laser light 40 to the droplet 20 generated by the droplet generator 10 in the EUV source ES to generate the EUV light 60. More particularly, in a state in which the droplet 20 is provided in the EUV source ES by the droplet generator 10, the laser light 40 generated by the laser generator 30 may be irradiated to the droplet 20 to generate the EUV light 60. In this process, residue may be generated in the EUV source ES. More particularly, the residue may be deposited or stacked in the housing H.

The collecting of the EUV light 60 in the light-collecting space defined by the housing H of the EUV source ES (S2) may include collecting the EUV light 60 generated by the droplet 20 and the laser light 40. The collecting of the EUV light 60 in the light-collecting space defined by the housing H (S2) may include reflecting the EUV light 60 by the EUV collector 50. More particularly, the EUV light 60 may be reflected by the reflection surface of the EUV collector 50. Thus, the EUV light 60 may escape the housing H through the IF-cap 300 (see FIG. 5).

The irradiating of the EUV light 60 to the photomask (S3) may include irradiating the EUV light 60 generated in the light-collecting space to the photomask, which may be the reticle R. More particularly, the EUV light 60 generated in the light-collecting space may be projected onto the photomask. The EUV light 60 may be reflected by the photomask. The photomask may impart a pattern to the EUV light 60 reflected by the photomask. That is, the portion of the EUV light 60 reflected by the photomask and the portion of the EUV light 60 absorbed by the photomask may define the pattern.

The exposing of the substrate to the EUV light 60 reflected by the photomask (S4) may include transferring the pattern of the reflected EUV light 60 to the substrate W. Thus, a pattern may be formed on the substrate W.

The exhausting of the residue in the EUV source ES into the exhaust pipe 203 (S5) may include exhausting the residue generated in the process of generating the EUV light 60 in the light-collecting space of the EUV source ES. The residue may be generated when the EUV light 60 is generated in the EUV source ES. For example, the residue may include tin. The residue may be exhausted through the exhaust pipe 203. In addition, the residue exhausted by the exhaust part 200 may be purified by the scrubber 205.

According to embodiments of the inventive concepts, in the EUV source, a substrate processing apparatus including the same, and a method of processing a substrate using the substrate processing apparatus, a residue in the EUV source may be exhausted. More particularly, the residue generated in a process of generating the EUV light may be exhausted through the exhaust pipe. Here, a position and an arrangement (e.g., angle) of the exhaust pipe may be adjusted or changed to effectively exhaust the residue. For example, in the case in which the exhaust pipe forms the acute angle with the first direction, the residue may be effectively exhausted through the exhaust pipe. In addition, in the case in which the exhaust pipe is coupled to the housing under a center portion of the housing, the residue may be smoothly exhausted through the exhaust pipe. In other words, the residue may be effectively exhausted by adjusting or changing the position and the angle of the exhaust pipe. Thus, contamination in the EUV source and a replacement period of the apparatus may be reduced, and an exposure process may be improved.

According to embodiments of the inventive concepts, in an EUV source, a substrate processing apparatus including the same, and a method of processing a substrate using the substrate processing apparatus, a residue in the EUV source may be effectively exhausted.

According to embodiments of the inventive concepts, in an EUV source, a substrate processing apparatus including the same, and a method of processing a substrate using the substrate processing apparatus in embodiments of the inventive concepts, light-collecting efficiency of the EUV source may be increased.

While embodiments of the inventive concepts have been particularly shown and described, it will be understood by one of ordinary skill in the art that variations in form and detail may be made therein without departing from the spirit and scope of the attached claims.

What is claimed is:

1. An extreme ultraviolet (EUV) source comprising:

a housing providing a light-collecting space having a cone shape becoming narrower in a first direction;

an EUV collector disposed at a first end portion of the housing and including a reflection surface disposed toward the light-collecting space;

an intermediate focus cap disposed on an upper housing and at a second end portion of the housing and configured to allow a passage of EUV light received from the EUV collector;

wherein an inner surface of the intermediate focus cap has a stepped shape; and an exhaust pipe coupled to the housing and providing an exhaust flow path connected to the light-collecting space, wherein the exhaust pipe extends from the housing and forms an acute angle with the housing toward the second end portion of the housing, wherein an angle formed between the housing and the exhaust pipe on a side of the exhaust pipe adjacent to the intermediate focus cap is about 55°, and wherein a center portion of an outlet is closer to the first end portion of the housing and the EUV collector than to the second end portion of the housing and the intermediate focus cap.

2. The EUV source of claim 1, wherein the center portion of the outlet at which the exhaust flow path is connected to the light-collecting space is disposed below a center portion of the light-collecting space extending in the first direction.

3. The EUV source of claim 1, wherein the housing comprises a lower housing to which the EUV collector is connected, wherein the lower housing comprises a plurality of housing through-holes spaced apart from each other at equal distances and disposed around the light-collecting space.

4. The EUV source of claim 1, wherein the housing comprises:

a lower housing to which the EUV collector is connected; and the upper housing disposed on the lower housing.

5. The EUV source of claim 1, wherein the exhaust flow path extends in a direction forming an acute angle with the first direction.

6. The EUV source of claim 1, further comprising a scrubber connected to the exhaust flow path and configured to purify a residue exhausted from the light-collecting space.

7. A substrate processing apparatus comprising:

a chamber;

an extreme ultraviolet (EUV) source disposed in the chamber and configured to generate EUV light;

an optical rig disposed in the chamber and configured to provide the EUV light generated from the EUV source to a reticle, and from the reticle to a substrate;

a substrate chuck disposed in the chamber and configured to support the substrate; and a reticle stage disposed in the chamber and configured to hold the reticle, wherein the EUV source comprises:

a housing providing a light-collecting space that narrows in a first direction;

an EUV collector disposed at a first end portion of the housing and including a reflection surface disposed toward the light-collecting space;

an intermediate focus cap disposed on an upper housing and at a second end portion of the housing;

wherein an inner surface of the intermediate focus cap has a stepped shape; and an exhaust pipe coupled to the housing and providing an exhaust flow path connected to the light-collecting space, wherein the exhaust pipe extends from the housing and forms an acute angle with the housing toward the second end portion of the housing, wherein an angle formed between the housing and the exhaust pipe on a side of the exhaust pipe adjacent to the intermediate focus cap is about 55°, wherein a center portion of an outlet at which the exhaust flow path meets the light-collecting space is disposed below a center portion of the light-collecting space extending in the first direction, and wherein the center portion of the outlet is closer to the first end portion of the housing and the EUV collector than to the second end portion of the housing and the intermediate focus cap.

8. The substrate processing apparatus of claim 7, wherein the reticle stage comprises:

a plasma source, and wherein the plasma source is configured to provide plasma onto the reticle stage to electrically neutralize the reticle charged by the EUV source.

9. The substrate processing apparatus of claim 8, wherein the reticle stage further comprises:

a reticle chuck, and wherein the plasma source is disposed outside the reticle chuck.

10. The substrate processing apparatus of claim 7, wherein the housing comprises:

a lower housing; and the upper housing connected to the lower housing.

11. The substrate processing apparatus of claim 10, wherein the lower housing comprises a plurality of housing through-holes penetrating the lower housing and connected to the light-collecting space.

12. The substrate processing apparatus of claim 10, wherein the intermediate focus cap is disposed at the second end portion of the housing and configured to allow a passage of EUV light received from the EUV collector, and wherein the intermediate focus cap has a cone shape becoming narrower in the first direction.

13. The substrate processing apparatus of claim 10, wherein the reflection surface has a parabolic shape and is disposed at the lower housing at the first end portion of the housing.

14. The substrate processing apparatus of claim 7, further comprising:

a scrubber connected to the exhaust pipe and configured to purify residue in the exhaust flow path, wherein the scrubber comprises a pump used to move the residue.

15. The substrate processing apparatus of claim 7, wherein the optical rig comprises: a plurality of optical systems configured to reflect the EUV light.

16. An extreme ultraviolet (EUV) source comprising:

a housing providing a light-collecting space having a cone shape becoming narrower in a first direction;

an EUV collector disposed at a first end portion of the housing and including a reflection surface disposed toward the light-collecting space;

an intermediate focus cap disposed at a second end portion of the housing;

wherein an inner surface of the intermediate focus cap has a stepped shape; and an exhaust pipe coupled to the housing and providing an exhaust flow path connected to the light-collecting space, wherein the exhaust pipe extends from the housing and forms an acute angle with the housing toward the second end portion of the housing, wherein an angle formed between the housing and the exhaust pipe on a side of the exhaust pipe adjacent to the intermediate focus cap is about 55°, and wherein a center portion of an outlet at which the exhaust flow path is connected to the light-collecting space is closer to the first end portion of the housing and the EUV collector than to the second end portion of the housing and the intermediate focus cap.

17. The EUV source of claim 16, wherein the center portion of the outlet at which the exhaust flow path is connected to the light-collecting space is disposed below a center portion of the light-collecting space extending in the first direction.

* * * * *